United States Patent [19]

Yoshida

[11] Patent Number: 5,144,259
[45] Date of Patent: Sep. 1, 1992

[54] AMPLIFIER HAVING A PUSH-PULL OUT-PUT STAGE

[75] Inventor: Yoshihiro Yoshida, Yokohama, Japan

[73] Assignee: Kabushiki Kaisha Toshiba, Kawasaki, Japan

[21] Appl. No.: 694,076

[22] Filed: May 1, 1991

[30] Foreign Application Priority Data

May 10, 1990 [JP] Japan .................. 2-120597

[51] Int. Cl.⁵ .......................... H03F 3/45; H03F 3/30
[52] U.S. Cl. ...................................... 330/255; 330/267
[58] Field of Search ............... 330/255, 263, 267, 268

[56] References Cited

U.S. PATENT DOCUMENTS 4,163,908  8/1979  Price .............................. 330/267 X
4,837,523  6/1989  Wright ............................. 330/255

FOREIGN PATENT DOCUMENTS 72207  4/1984  Japan ................................ 330/267

OTHER PUBLICATIONS

Electronique Radio Plans, No. 503, pp. 29-35, Paris, France "Structure des amplificateurs video" (Oct. 1989).
Wireless World, vol. 77, No. 1, pp. 23-26 "Elements of Linear Microcircuits" (Jan. 1971).
IEEE Journal of Solid-State Circuits, vol. SC-16, No. 4, pp. 261-266 "A High-Voltage IC for a Transformerless Trunk and Subscriber Line Interface" (Aug. 1981).

Primary Examiner—James B. Mullins
Attorney, Agent, or Firm—Banner, Birch, McKie & Beckett

[57] ABSTRACT

An amplifier comprises a first transistor of first polarity type having its emitter connected to a first input terminal and its base and collector connected to a second input terminal, a second transistor of second polarity type having its base connected to the second input terminal, its collector connected to a first potential supply terminal and its emitter connected to a second potential supply terminal through a first current source, a third transistor of first polarity type having its base connected to the emitter of the second transistor, its collector connected to the second potential supply terminal and its emitter connected to an output terminal, and a fourth transistor of second polarity type having its base connected to the first input terminal, its collector connected to the first potential supply terminal and its emitter connected to the output terminal, wherein the first to fourth transistors constitute a push-pull output circuit. The push-pull output circuit may be used at the subsequent stage of a differential amplifier section.

12 Claims, 3 Drawing Sheets

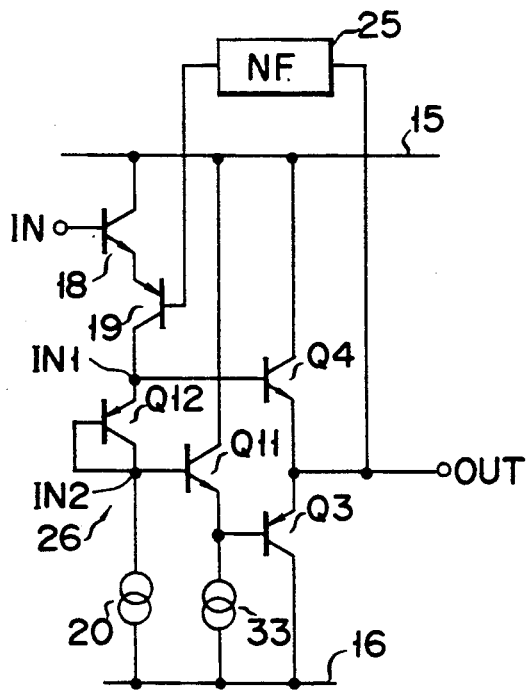
F I G. 7
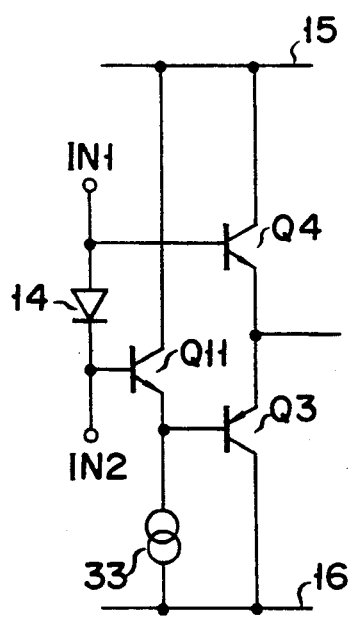
F I G. 8

AMPLIFIER HAVING A PUSH-PULL OUT-PUT STAGE

BACKGROUND OF THE INVENTION

1. Field of the Invention

The present invention relates to an amplifier having an improved push-pull output stage and, in particular, to an amplifier suitable for an IC fabrication.

2. Description of the Related Art

FIG. 1 shows an ordinary voltage follower circuit. Here, reference numerals 11 and 12 represent a differential input stage and output stage, respectively. In the circuit shown in FIG. 1, the output stage 12 is of an emitter follower configuration and a sink current at the output stage OUT is determined by an internal constant current source 13. As a way for increasing an output sink current, an output stage 21 is provided as a push-pull output circuit as shown in FIG. 2. In the circuit shown in FIG. 2, a transistor Q4 is driven from a differential input stage transistor Q1 side via a current mirror circuit 22 and transistor Q21. A transistor Q3 is driven from a differential input stage transistor Q2 side via current mirror circuits 23 and 24 and transistors Q22. With the collector current and base current of the transistor Q3 represented by IC and IB, the following relation holds:

$$I_C/I_B = h_{FE} \text{ (current amplification factor)}$$

If an input IN2 is to be connected to the collector of the transistor Q2 by omitting the current mirror circuits 23 and 24 which provide a cause for a complicated arrangement, then an equal potential is applied to the collector and emitter of the transistor Q2, that is, a potential on the output OUT becomes a level dropped by a base to-emitter voltage $V_{BE}$, causing the transistor Q2 to be driven into saturation. This connection cannot be achieved with an omission of the current mirror circuits 23 and 24, resulting in a complex circuit.

FIG. 3 shows a known output stage 31 using transistors Q11 and Q12 and constant current sources 32 and 33 which eliminate the necessity of paying particular attention to the levels on IN1 and IN2 in FIG. 3. This circuit requires two constant current sources 32 and 33.

SUMMARY OF THE INVENTION

It is accordingly the object of the present invention to provide an amplifier which can provide a push-pull output circuit of less number of elements without causing a differential input stage element to be driven into saturation.

According to the present invention, there is provided an amplifier, comprising:

a first transistor of first polarity type having its emitter connected to a first input terminal and its base and collector connected to a second input terminal;

a second transistor of second polarity type having its base connected to the second input terminal, its collector connected to a first potential supply terminal and its emitter connected to a second potential supply terminal through a first current source;

a third transistor of first polarity type having its base connected to the emitter of the second transistor, its collector connected to the second potential supply terminal and its emitter connected to an output terminal and a fourth transistor of second polarity type having its base connected to the first input terminal, its collector connected to the first potential supply terminal and its emitter connected to the output terminal, wherein the first to fourth transistors constitute a push-pull output circuit.

That is, according to the present invention, potentials on the first and second input terminals are equal to the first transistor's base-to-emitter voltage $V_{BE} \approx 0.65$ V and the second input terminal and output terminal are set to an equal potential. If a differential amplifier section is provided at the preceding stage of the amplifier, a potential difference $V_{BE}$ can be applied across the collector and the emitter of the differential input stage transistor of the differential amplifier. The second input terminal can be connected directly to the collector of the differential input stage transistor in the preceding stage without causing the differential input stage transistor to be driven into saturation. Further, the first input terminal is provided in the aforementioned transistor and the push-pull output circuit is driven. Thus the resultant circuit requires the use of only one constant current source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 to 8, each, are a circuit diagram showing an amplifier according to another embodiment of the present invention.

DETAILED DESCRIPTION OF THE PREFERRED EMBODIMENTS

The embodiments of the present invention will be explained below with reference to the accompanying drawings.

Figure 4:
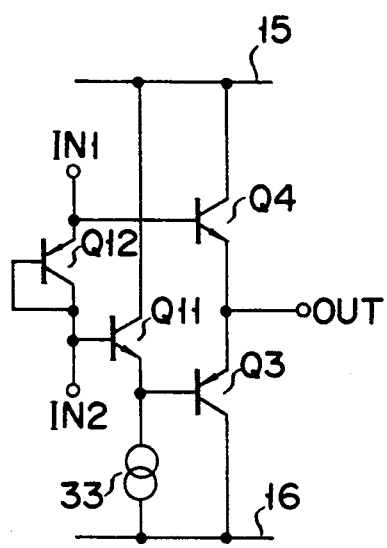
FIG. 4 is a circuit diagram showing an amplifier according to one embodiment of the present invention.

FIG. 4 is a circuit diagram showing principle of an output circuit section, the same reference numerals being employed to designate parts or elements corresponding in function to those shown in the known circuit. As shown in FIG. 4, a PNP transistor Q12 has its emitter connected to a first input terminal IN1 for push-pull circuit drive and its base and collector connected to a second input terminal IN2 and an NPN transistor Q11 has its base connected to the second input terminal IN2, its collector connected to a high potential power source 15 and its emitter connected to a low potential power source 16 through a constant current source 33, a PNP transistor Q3 has its base connected to the emitter of the transistor Q11, its collector connected to the low potential power source 16 and its emitter connected to an output terminal OUT, and an NPN transistor Q4 has its base connected to the first input terminal IN1, its collector connected to the high potential power source 15 and its emitter connected to the output terminal OUT. This arrangement provides a push-pull output circuit. The circuit shown in FIG. 4 includes a single constant current source (the constant current source 33) in which a potential difference across the terminals IN1 and IN2 is $V_{BE} \simeq 0.65$ V and potentials on the terminals IN2 and OUT are set to the same level.

Figure 5:
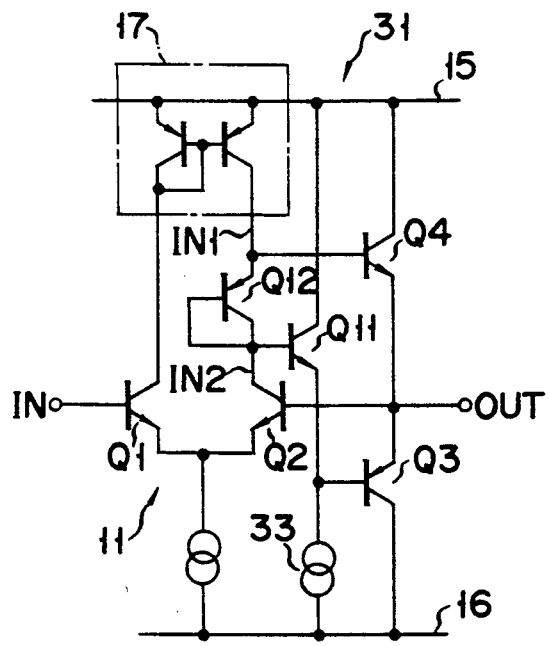

FIG. 5 shows a voltage follower circuit according to another embodiment of the present invention where the circuit shown in FIG. 4 is employed as an output circuit 31. In the circuit shown in FIG. 5, a differential amplifier 11 is provided as an input stage, a differential input stage transistor Q1 has its base connected to an input terminal and its collector current suppled to the input of a current mirror circuit 17, an output current of a current mirror circuit 17 is supplied to the input terminal IN1, and a differential input stage element (transistor) Q2 has its base connected to an output terminal OUT and its collector current supplied to an input terminal IN2.

In FIG. 5, potentials on the output terminal OUT (the base of the transistor Q2) and input terminal IN2 are set to substantially the same level. Therefore, a potential difference $V_{BE}$ can be set between the collector and the emitter of the transistor Q2 and the input terminal In2 can be connected directly to the collector of the transistor Q2 without causing the transistor Q2 to be driven into saturation.

The operation of the circuit shown in FIG. 5 is as follows:

If the input terminal IN and output terminal OUT are balanced, the input and output currents of the current mirror circuit 17 are equal to each other and hence the collector currents of the transistors Q1 and Q2 should be set to an equal level. Therefore, voltages $V_{BE}$ on the transistors Q1 and Q2 should be set to an equal level. It follows that the potentials on the input terminal IN and output terminal OUT are equal to each other.

If, here, a voltage on the input terminal IN goes high, a voltage $V_{BE}$ on the transistor Q1 is made greater and collector current in the transistor Q1 is made greater and turned back at the current mirror circuit 17. Thus, the greater current flows through the bases of the transistors Q4 and Q11. As a result, the base current in the transistor Q11 serves to turn a transistor Q3 OFF and the base current in the transistor Q4 serves to go toward the output terminal OUT and a potential on the output terminal OUT goes high. The potentials on the input and output terminals IN and OUT are made at a stable state where there is a coincidence in level between the two. When the potential on the input terminal IN goes negative, a reverse operation results unlike the situation as set out above.

The aforementioned embodiment has the following advantages.

Figure 1:
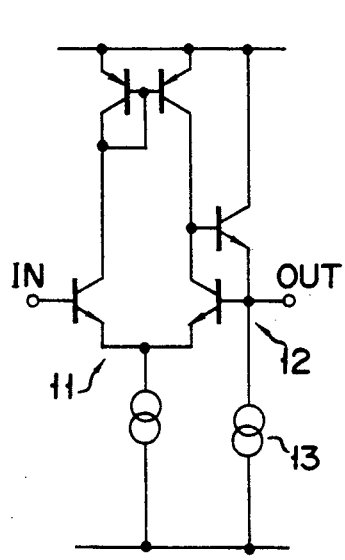
FIGS. 1 to 3, each, show a conventional amplifier.
Figure 2:
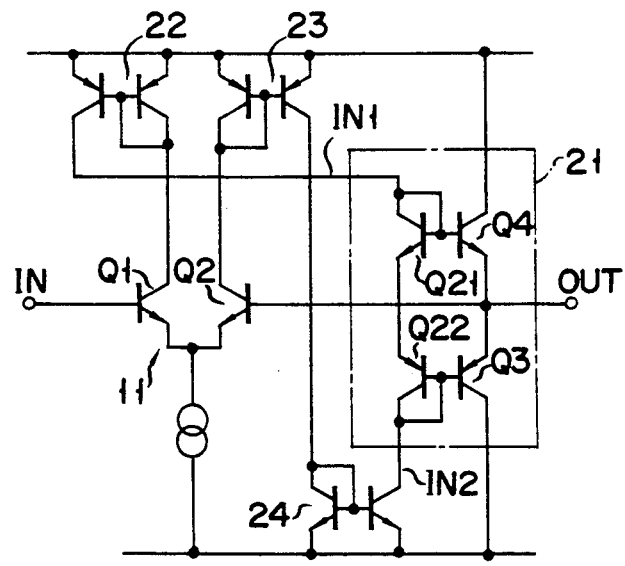

The current amplification factors of the output stage in the circuit shown in FIG. 2 are:
$h_{FE}$(NPN) times at an upper side (Q4) and
$h_{FE}$(PNP) times at a lower side (Q3) of the circuit shown in FIG. 2.

Figure 3:
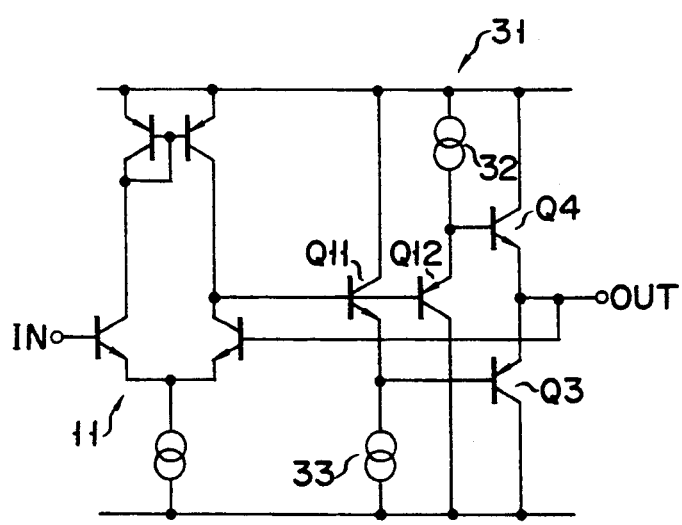

The current amplification factors of the output stage in the circuit shown in FIG. 3 are:
$h_{FE}$(PNP)$\times h_{FE}$(NPN) time at an upper side (Q12, Q4) and
$h_{FE}$(NPN)$\times h_{FE}$(PNP) times at a lower side (Q11, Q3) of the circuit shown in FIG. 3.

The current amplification factors of the output stage in the circuit shown in FIG. 4 are
$h_{FE}$(NPN) times at an upper side (Q4)
$h_{FE}$(NPN)$\times h_{FE}$(PNP) times at the lower side (Q11, Q3) of the circuit shown in FIG. 4.

From the results as set out above, the circuit of FIG. 3 appears best as the current amplification factor, but, in an actual integrated circuit, the current amplification factor is $h_{FE}$(PNP)$<h_{FE}$(NPN) times since a lateral type transistor is employed as the PNP transistor. It is very important to compensate for the current amplification factor hFE of the lateral PNP transistor. In actual practice, there may be almost no difference between the cases of FIGS. 3 and 4. The circuit of FIG. 3 requires two current sources (32, 33), while, on the other hand, the circuit of FIG. 4 requires one constant current source (33) to achieve less number of elements.

Figure 6:
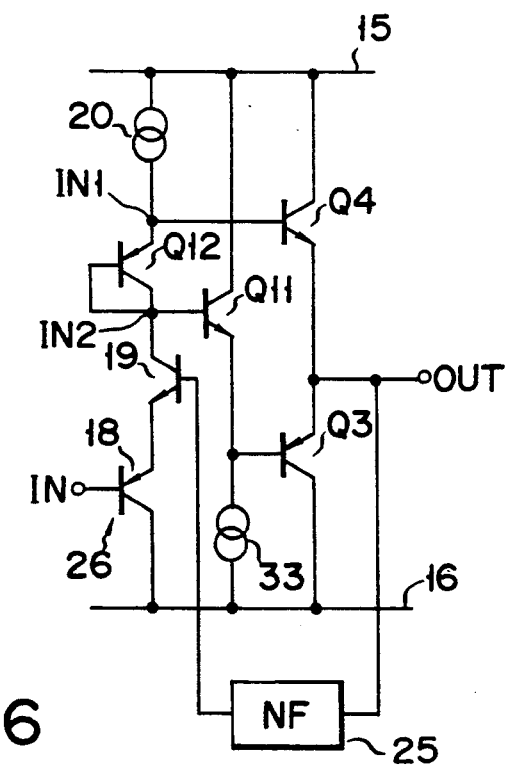

FIG. 6 shows another embodiment of the present invention. In the embodiment shown in FIG. 6, the circuit of FIG. 4 is applied to a complementary differential amplifier including a PNP transistor 18, NPN transistor 19 and constant current source 20 at an input stage. A negative feedback circuit 25 is connected across the base of the input stage transistor 19 and an output terminal OUT, noting that a positive feedback circuit may be employed instead. In the circuit shown in FIG. 6, the base of the transistor 19, which serves as the feedback terminal, goes high by an amount $2V_{BE}$ with respect to an input terminal IN. If the base of the transistor 19 is connected to the output terminal OUT through the feedback circuit 25, the gain and frequency characteristic can optionally be set by properly designing the arrangement of the feedback circuit 25.

FIG. 7 shows a variant of the circuit shown in FIG. 6. Although, in the circuit shown in FIG. 6, the input terminal IN is provided on a low potential side, the circuit shown in FIG. 7 is symmetrically arranged relative to that shown in FIG. 6 such that an input terminal IN is provided on a high potential side, and can obtain the same advantage as in the circuit shown in FIG. 6.

The present invention is not restricted to the aforementioned embodiments only, but various changes or modifications of the invention may be made without departing from the spirit and scope of the present invention. For example, the transistor Q12 as a diodeconnected transistor in the previous embodiments may be equivalently replaced by an ordinary diode 14 as shown in FIG. 8. In the embodiments shown in FIGS. 4 to 7, the transistors Q3 and Q12 are of the same polarity and the transistors Q4 and Q11 are of the same polarity, thus ensuring a better pairing property. It is thus possible to cancel a variation in temperature characteristic between the transistors as well as a variation in products manufactured.

According to the present invention, an amplifier using a push pull output circuit can be manufactured with less number of elements.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An amplifier comprising:

a first transistor of first polarity type having its emitter connected to a first input terminal and its base and collector connected to a second input terminal;

a second transistor of second polarity type having its base connected to the second input terminal, its collector connected to a first potential supply terminal and its emitter connected to a second potential supply terminal through a first current source;

a third transistor of first polarity type having its base connected to the emitter of the second transistor, its collector connected to the second potential supply terminal and its emitter connected to an output terminal; and a fourth transistor of second polarity type having its base connected to the first input terminal, its collector connected to the first potential supply terminal and its emitter connected to the output terminal, wherein the first to fourth transistors constitute the push-pull output circuit, and a differential amplifier is provided at an input stage and comprises a pair of fifth and sixth transistors, the fifth transistor having its collector current supplied to a current mirror circuit, an output current in the current mirror circuit being input to the first input terminal of the push-pull output circuit, the sixth transistor having its base connected to the output terminal of the push-pull output circuit and its collector current supplied to the second input terminal of the push-pull output circuit, providing a voltage follower circuit.

2. A push-pull output circuit for an amplifier having first and second out-puts, comprising:

first and second input terminals for receiving the first and second outputs of said amplifier;

an output terminal;

first and second potential sources;

a first circuit element connected between said first and second input terminals;

a first transistor of a first polarity type having a base coupled to said second input terminal, a collector directly connected to said first potential source, and an emitter;

a constant current source coupled between the emitter of said first transistor and said second potential source;

a second transistor of a second polarity type having a base coupled to the emitter of said first transistor, a collector coupled to said second potential source, and an emitter coupled to said output terminal; and a third transistor of the first polarity type having a base coupled to said first input terminal, a collector coupled to said first potential source, and an emitter coupled to said output terminal.

3. The push-pull output circuit according to claim 2, wherein said first circuit element comprises a fourth transistor of the second polarity type having an emitter coupled to said first input terminal, a base coupled to said second input terminal, and a collector coupled to said second input terminal.

4. An amplifier having a push-pull stage output, comprising:

first and second push-pull stage input nodes;
a push-pull stage output node;
first and second potential sources;
a first circuit element connected between said first and second push-pull stage input nodes;

a first transistor of a first polarity type having a base coupled to said second push-pull stage input node, a collector directly connected to said first potential source, and an emitter;

a first constant current source coupled between the emitter of said first transistor and said second potential source;

a second transistor of a second polarity type having a base coupled to the emitter of said first transistor, a collector coupled to said second potential source, and an emitter coupled to said push-pull stage output node;

a third transistor of the first polarity type having a base coupled to said first push-pull stage input node, a collector coupled to said first potential source, and an emitter coupled to said push-pull stage output node;

an amplifier input section receiving first and second amplifier inputs and outputting first and second amplifier outputs to said first and second push-pull stage input nodes, respectively; and an amplifier output terminal coupled to said push-pull stage output node.

5. The amplifier according to claim 4, wherein said amplifier input section comprises a differential amplifier input section including:

a fourth transistor having a base coupled to said push-pull stage output node for receiving the first amplifier input, a collector coupled to said second push-pull stage input node, and an emitter;

a fifth transistor having a base coupled to receive the second amplifier input, an emitter coupled to the emitter of said fourth transistor, and a collector;

a current mirror circuit having an input terminal coupled to the collector of said fifth transistor and an output terminal coupled to said first push-pull stage input node; and a second constant current source coupled between a connection node of the coupled emitters of said fourth and fifth transistors and said second potential source.

6. The amplifier according to claim 4, wherein said first circuit element comprises a fourth transistor of the second polarity type having an emitter coupled to said first push-pull stage input node, a base coupled to said second push-pull stage input node, and a collector coupled to said second push-pull stage input node.

7. The amplifier according to claim 4, wherein said first circuit element comprises a diode having an anode coupled to said first push-pull stage input node and a cathode coupled to said second push-pull stage input node.

8. An amplifier having a push-pull stage output, comprising:

first and second push-pull stage input nodes;
a push-pull stage output node;
first and second potential sources;
a first circuit element connected between said first and second push-pull stage input nodes;

a first transistor of a first polarity type having a base coupled to said second push-pull stage input node, a collector directly connected to said first potential source, and an emitter;

a first constant current source coupled between the emitter of said first transistor and said second potential source;

a second transistor of a second polarity type having a base coupled to the emitter of said first transistor, a collector coupled to said second potential source, and an emitter coupled to said push-pull stage output node;

a third transistor of the first polarity type having a base coupled to said first push-pull stage input node, a collector coupled to said first potential source, and an emitter coupled to said push-pull stage output node;

an amplifier input section receiving first and second amplifier inputs and outputting first and second amplifier outputs to said first and second push-pull stage input nodes, respectively;

an amplifier output terminal coupled to said push-pull stage output node; and a feedback circuit coupled to said amplifier output terminal and providing and first amplifier input.

9. The amplifier according to claim 8, wherein said first circuit element comprises a fourth transistor of the second polarity type having an emitter coupled to said first push-pull stage input node, a base coupled to said second push-pull stage input node, and a collector coupled to said second push-pull stage input node.

10. The amplifier according to claim 8, wherein said first circuit element comprises a diode having an anode coupled to said first push-pull stage input node and a cathode coupled to said second push-pull stage input node.

11. The amplifier according to claim 8, wherein said amplifier comprises a complementary differential amplifier including:

a fourth transistor of the second polarity type having a base coupled to receive the second amplifier input, a collector coupled to said second potential source, and an emitter;

a fifth transistor of the first polarity type having a base coupled to said feedback circuit to receive the first amplifier input, an emitter coupled to the emitter of said fourth transistor, and a collector coupled to said second push-pull stage input node; and a second constant current source coupled between said first potential source and said first push-pull stage input node.

12. The amplifier according to claim 8, wherein said amplifier comprises a complementary differential amplifier including:

a fourth transistor of the first polarity type having a base coupled to receive the second amplifier input, a collector coupled to said first potential source, and an emitter;

a fifth transistor of the second polarity type having a base coupled to said feedback circuit to receive the first amplifier input, an emitter coupled to the emitter of said fourth transistor, and a collector coupled to said first push-pull stage input node; and a second constant current source coupled between said second push-pull stage input node and said second potential source.

* * * * *